United States Patent
D'Asaro et al.

[19]

[11] Patent Number: 6,048,751

[45] Date of Patent: Apr. 11, 2000

[54] PROCESS FOR MANUFACTURE OF COMPOSITE SEMICONDUCTOR DEVICES

[75] Inventors: Lucian Arthur D'Asaro, Madison; Keith Wayne Goossen, Aberdeen; Sanghee Park Hui, New Providence; Betty J. Tseng, Berkeley Heights; James Albert Walker, Howell, all of N.J.

[73] Assignee: Lucent Technologies Inc., Murray Hill, N.J.

[21] Appl. No.: 08/572,275

[22] Filed: Dec. 13, 1995

Related U.S. Application Data

[63] Continuation-in-part of application No. 08/366,864, Dec. 30, 1994, Pat. No. 5,778,162, which is a continuation-in-part of application No. 08/236,307, May 2, 1994, abandoned, and application No. 08/083,742, Jun. 25, 1993, Pat. No. 5,385,632.

[51] Int. Cl.[7] ........................... H01L 21/54; H01L 21/58; H01L 21/60

[52] U.S. Cl. ......................... 438/109; 438/118; 438/455; 156/630; 156/631; 156/633; 156/659.1; 156/622; 156/657

[58] Field of Search ..................................... 156/630, 631, 156/633, 659.1, 662, 657; 438/109, 118, 455, FOR 426

[56] References Cited

U.S. PATENT DOCUMENTS

| | | |
|---|---|---|
| 4,764,804 | 8/1988 | Sahara et al. . |
| 4,954,458 | 9/1990 | Reid . |
| 5,135,878 | 8/1992 | Bartur . |
| 5,478,781 | 12/1995 | Bertin et al. . |

*Primary Examiner*—David E. Graybill

[57] ABSTRACT

An integrated semiconductor device is formed from two fabricated semiconductor devices each having a substrate by placing an etch-resist on the substrate of the one semiconductor device, by bonding the conductors of one of the fabricated semiconductor devices to the conductors of the other fabricated semiconductor device, flowing an uncured cement (e.g. epoxy) between the etch-resist and the other substrate, allowing the cement to solidify, and removing the substrate from the one of the semiconductor devices. More specifically, a hybrid semiconductor device is formed from a GaAs/AlGaAs multiple quantum well modulator having a substrate and an IC chip having a substrate by placing an etch resist on the modulator substrate, bonding the conductors of the modulator to the conductors of the chip, wicking an uncured epoxy between the modulators and the chip, allowing the epoxy to cure, and removing the substrate from the modulator.

10 Claims, 4 Drawing Sheets

6,048,751

PROCESS FOR MANUFACTURE OF COMPOSITE SEMICONDUCTOR DEVICES

REFERENCE TO RELATED APPLICATIONS

This application is a continuation-in-part of U.S. application Ser. No. 08/366,864 filed Dec. 30, 1994, U.S. Pat. No. 5,778,162, which is a continuation-in-part of divisional U.S. application Ser. No. 08/236,307, filed May 2, 1994, abandoned, and of U.S. application Ser. No. 083,742, filed Jun. 25, 1993, now U.S. Pat. No. 5,385,632, all assigned to the same assignee as this application.

FIELD OF THE INVENTION

This invention relates to bonding of fully-fabricated semiconductor devices onto other fully-fabricated semiconductor devices so as to produce integrated units, and particularly to bonding fully-fabricated photonic elements, such as GaAs/AlGaAs multiple quantum well (MQW) modulators, onto fully-fabricated integrated circuit (IC) chips such as Si or even GaAs.

BACKGROUND OF THE INVENTION

Integration of photonic devices with silicon IC chips makes it possible to combine the advantages of each. Among photonic devices, GaAs/AlGaAs multiple quantum well (MQW) modulators are particularly beneficial as input/output (I/O) elements on IC chips because they have a high absorption coefficient of light and can serve as both receivers and transmitters. They typically operate at an optical wavelength ($\lambda$) of 850 nm (nanometers).

The aforementioned applications Ser. No. 083,784, filed Jun. 25, 1993, Ser. No. 08/236,307, filed May 2, 1994, and Ser. No. 08/366,864 filed Dec. 30, 1995, disclosed methods of bonding a photonic element, such as a GaAs/AlGaAs (MQW) modulator, to an IC chip by bonding their respective terminals to each other, filling the interiors between them with photoresist or a photoresisting cement, and then removing the substrate of the photonic device. Ser. No. 08/366,864 specifically discloses wicking a cement, such as epoxy into the interstices in place of the photoresist. However, voids that extent to one or both substrates sometimes form in the cement. These may allow that etch that removes the substrate on the modulator to affect other parts of the combined unit.

SUMMARY OF THE INVENTION

An embodiment of the invention involves confining the surface of the substrate with an etch-resist before bonding the conductors of one fabricated semiconductor device having a substrate to the conductors on another fabricated semiconductor device having a substrate, flowing an uncured cement between the devices, allowing the etch-resist to solidify, and removing the substrate from one of the semiconductor devices.

The various feature of novelty which characterize the invention are pointed out in the claims. Objects and advantages of the invention will become evident from the following detailed description when read in light of the accompanying drawings.

DETAILED DESCRIPTION OF PREFERRED EMBODIMENTS

Figure 1:
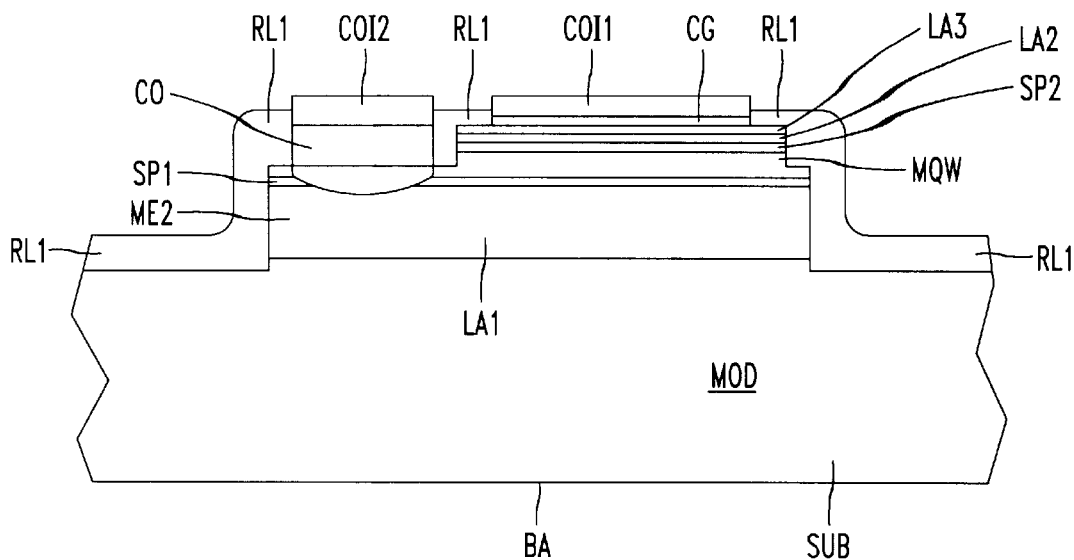
FIG. 1 is a cross-sectional view illustrating a photonic device in the form of an MQW modulator containing a multiple quantum well modulator unit.

FIGS. 1–4 illustrate a GaAs/AlGaAs 850 nm $\lambda$ multiple quantum well modulator MOD, and a solder-bonding technique for integrating the GaAs/AlGaAs 850 nm $\lambda$ modulator with an IC to form the device embodying the invention. FIG. 1 illustrates a multi-strata multiple quantum well modulator MOD arranged, according to an embodiment of the invention, for bonding to contacts on a Si device according to the invention.

In the modulator MOD, a GaAs substrate SUB supports a 1.5 $\mu$m layer LA1 of n (i.e. n-doped) ($10^{18}$ cm$^{-3}$) $Al_{0.3}Ga_{0.7}As$ grown on the substrate SUB. A 100 Å i (i.e. intrinsic) $Al_{0.3}Ga_{0.7}As$ spacer SP1 on the layer LA1 spaces the latter from an i multiple quantum well modulator unit MQW composed of 55 periods of 90 Å GaAS wells and 30 Å $Al_{0.3}Ga_{0.7}As$ barriers. A 70 Å i $Al_{0.3}Ga_{0.7}As$ spacer SP2 on the multiple quantum well modulator unit MQW spaces the latter from a 500 Å p (i.e. p-doped) ($10^{18}$ cm$^{-3}$) $Al_xGa_{1-x}As$ layer LA2 graded from X=0.3 to x=0, on the spacer SP2. A 500 Å p$^+$ ($5*10^{18}$ cm$^{-3}$) GaAs layer LA3 covers the layer LA2.

The modulator MOD, at the substrate SUB, forms a 5 mm square piece and has 110×110 $\mu$m gold p contacts CG (1000 Å thick) deposited on the layer LA3. The strata MQW, SP2, LA2, LA3, and CG form a 130×130 $\mu$m inner mesa ME that extends to within 1500 Å of the n layer LA1. A 50×120 $\mu$m, 7000 Å thick, AuGe/Au n contact CO on the n layer LA1 extends upwardly to make its top coplanar with the gold p contact CG. 4000 Å In caps COI1 and COI2 cover respective contacts CG and CO. Redundant etch-resist layer RL1 covers the substrate SUB and the strata of the modulator unit MQW.

Manufacture of the modulator MOD is described in detail in the aforementioned applications Ser. No. 083,742 filed Jun. 25, 1993, Ser. No. 08/236,307 filed May 24, 1995 and Ser. No. 08/366,864 filed Dec. 30, 1995. In the present embodiment for manufacture of the modulator in FIG. 1, the procedure in part concludes with deposition of the resist layer RL1.

Figure 2:
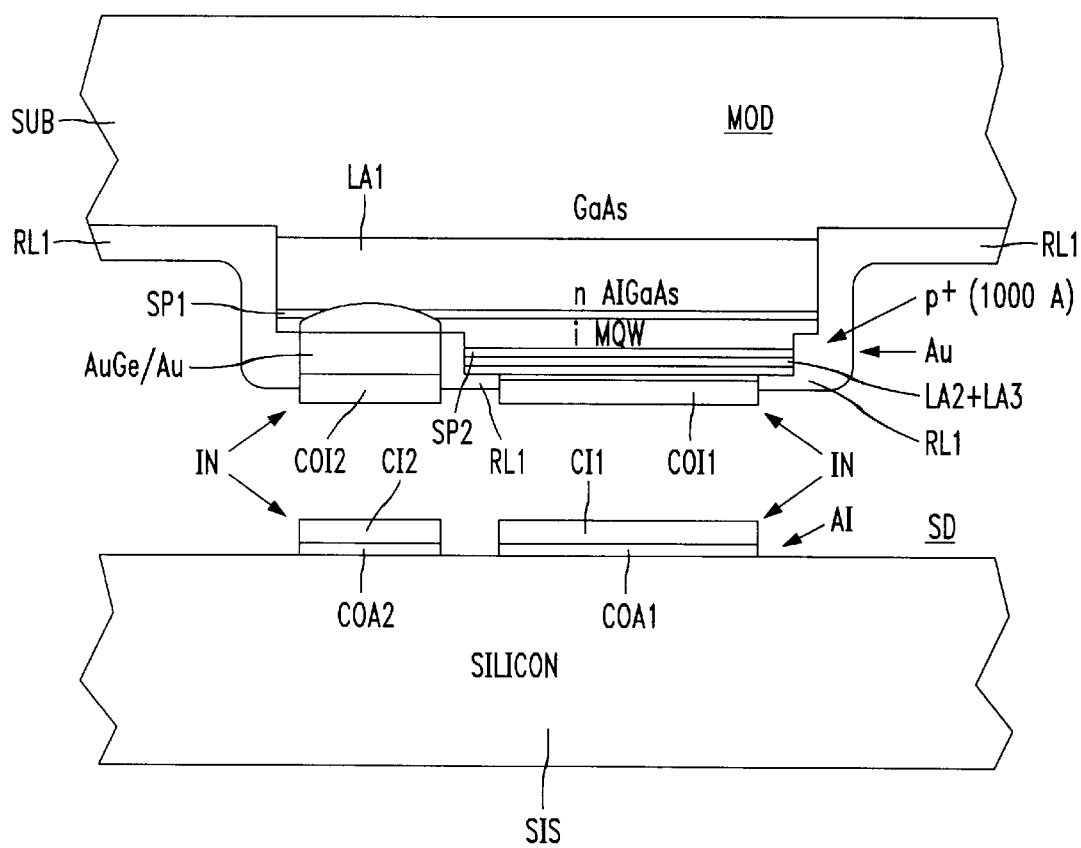
FIG. 2 is a cross-sectional view illustrating an arrangement in a step for forming a device that integrates the multiple quantum well modulator with an integrated circuit chip according to an embodiment of the invention.

FIG. 2 illustrates the modulator MOD of FIG. 1 upside down in position above a portion of a Si device SD, such as an IC chip, as a step in formation of the integrated hybrid device of this embodiment. In FIG. 2 the device SD includes a 1 cm square p type Si substrate SIS with Al contacts COA1 and COA2 of the same size and spacing as the p and n contacts CG and CO on the modulator MOD. These Al contacts COA1 and COA2 are set to extend out of the page of FIG. 2 so that they would be exposed when the hybridization process is completed according to an embodiment of the invention. Indium contacts CI1 and CI2 on the Al contacts also have the same size and spacing as the modulator contacts CG and CO.

To integrate the modulator MOD with an IC chip, the following occurs:

Patterning a 1 cm square p type Si substrate SIS with Al contacts COA1 and COA2 of the same size and spacing as the p and n contacts CG and CO on the modulator MOD. These Al contacts COAL and COA2 are set to extend out of the page of FIG. 2 so that they would be exposed upon completion of the hybridization process according to an embodiment of the invention.

Depositing indium contacts COI1 and COI2 on the Al with the same size and spacing of the modulator contacts CG and CO.

Placing the modulator MOD upside down on the Si piece and aligning it. According to an embodiment of the invention, a precision controller aligns the modulator MOD on the Si device SD.

Figure 3:
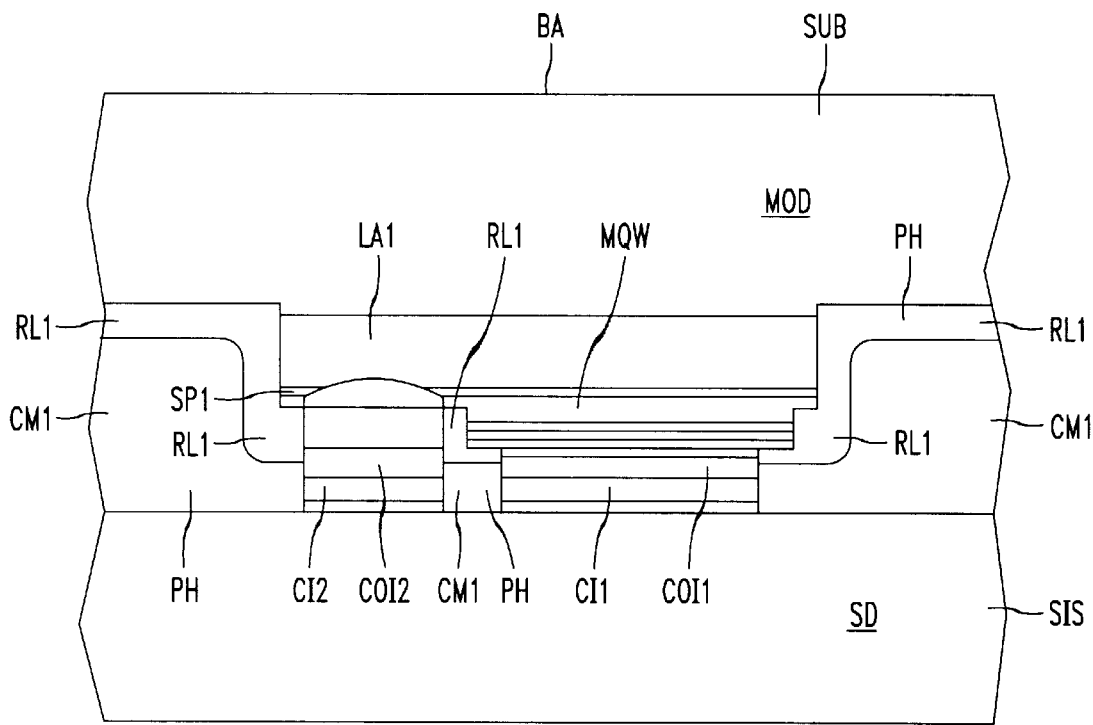
FIG. 3 is a cross-sectional view illustrating an arrangement in another step for forming a device integrating the multiple quantum well modulator with an integrated circuit chip according to an embodiment of the invention.

FIG. 3 shows the modulator MOD on the Si device SD with the In contacts COI1 and COI2 bonded to the contacts CI1 and CI2. Here cement CM1 surrounds the contacts CG, CO, COI1, COI2, COA1, COA2, CI1 and CI2 below the layer RL1. The structure in FIG. 3 is achieved by the following steps.

Heating the unit to 200° C. for 15 minutes to melt the indium contacts into each other. At this point the resulting unit is relatively stable (i.e., shaking does not cause it to break apart).

Wicking liquid cement CM1, such as epoxy, between the modulator MOD and the Si device SD by depositing drops of cement on the Si substrate about the GaAs/AlGaAs modulator MOD and allowing it to flow against its edge. The cement CM1 flows between the layer RL1 and the Si device SD.

Curing the cement CM1 as need. The dried cement CM1 serves two purposes. First, it protects the modulator MOD during substrate etching. Second, it provides additional mechanical support.

Figure 4:
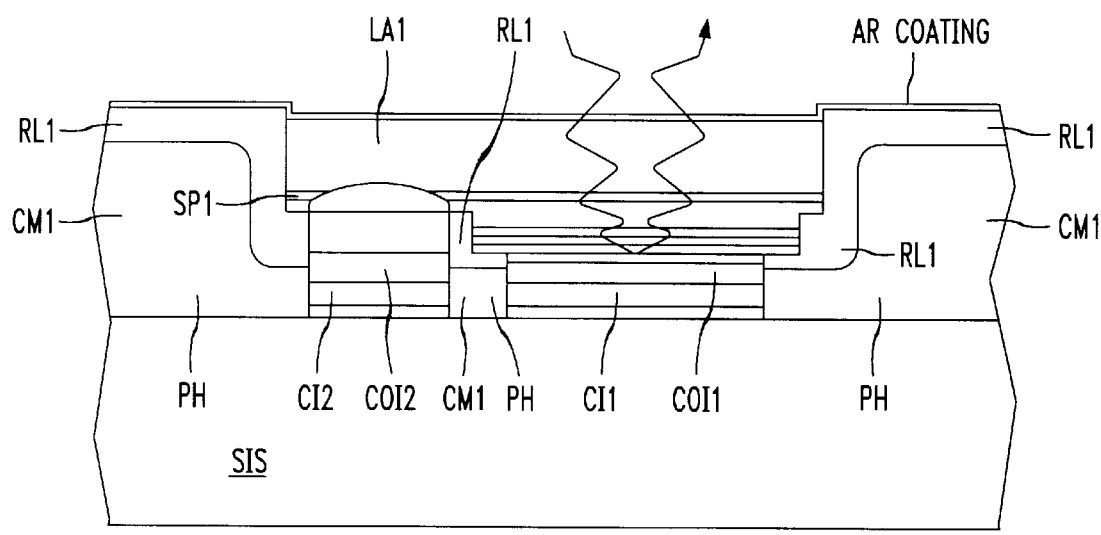
FIG. 4 is a cross-sectional view illustrating a device integrating a photonic element with an electronic element according to an embodiment and embodying aspects of the invention.

FIG. 4 illustrates a structure embodying the invention. Here an AR coating covers the MQW modulator MOD and the surrounding photoresist PH. This structure is the result of the following steps.

Placing a drop of KOH solution on the surface of the exposed GaAs to remove any GaAs oxide.

Chemically removing the GaAs substrate SUB from the modulator MOD with a jet etcher by delivering a 1×1 mm jet of enchant onto the surface of the substrate SUB. The enchant is 100:1 $H_2O_2$:$NH_4OH$, which stops on the $Al_{0.3}Ga_{0.7}As$ layer LA1. The GaAs enchant does not attack the photoresist appreciably nor Si or Al to the sides of the GaAs/AlGaAs modulator. The enchant etches the substrate SUB in about 1.5 hours.

According to an embodiment of the invention, bond pads extend to the edge of the silicon device SD1 and the cement CM1 is applied without coating them. According to another embodiment of the invention, the chip is wire-bonded and packaged before commencing the process.

After wire-bonding the Al pads of a modulator MOD, an SiOx AR-coating AR is deposited. The gold p contact CG serves as an integral reflector.

Yet another embodiment of the invention involves selective photo-chemical removal of the cement CM1 at the bond pads.

Another embodiment includes using a solvent to remove the photoresist layers and the cement CM1 completely. This leaves the integrated device of Si chip and modulator MOD without the mechanical support of the etch-resist, but also without the mechanical burden of the substrate SUB.

According to an embodiment of the invention, the single modulator MOD and the single connection to the Si device SD of FIGS. 1 to 4 represents but one of a number of an array of modulators MOD. Each of the latter is grown on a single substrate and bonded to corresponding contacts on the device SD with the single substrate SUB then removed.

Figure 5:
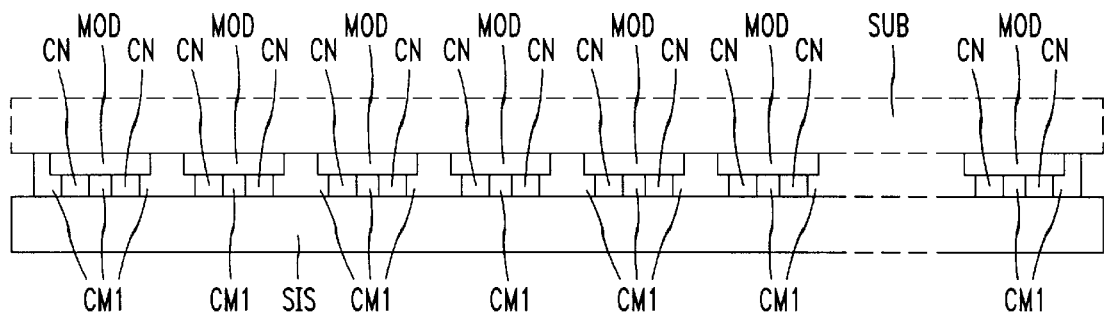
FIG. 5 is a cross-sectional view illustrating a device integrating a number of photonic elements on an IC and arranged according to an embodiment of the invention.

FIG. 5 is a cross-sectional view illustrating a device integrating a number of photonic elements with electronic elements of an IC chip and embodying aspects of the invention. Here, a number of modulators MOD, identical to the modulators MOD in FIG. 4, are bonded via bonded contacts CN collectively representing the contacts CG, CO, COI1, COI2, COA1, COA2, CI1 and CI2 to the substrate SIS of a Si device SD. The bonding process is the same as the process in FIGS. 2 to 4 except that all the modulators MOD start on a single substrate SUB and the Si device includes a number of conductor pairs each matching the conductor pair of the modulator MOD above that pair. Layer RL1 as well as cement CM1 extend between and around the contacts CN and the modulators MOD. A single previously-removed substrate SUB for the modulators MOD appear in phantom lines. Layer RL1 as well as cement CM1 extend, with layer RL1 on top of the cement CM1, between the substrate SIS and the level of the removed substrate SUB.

Figure 6:
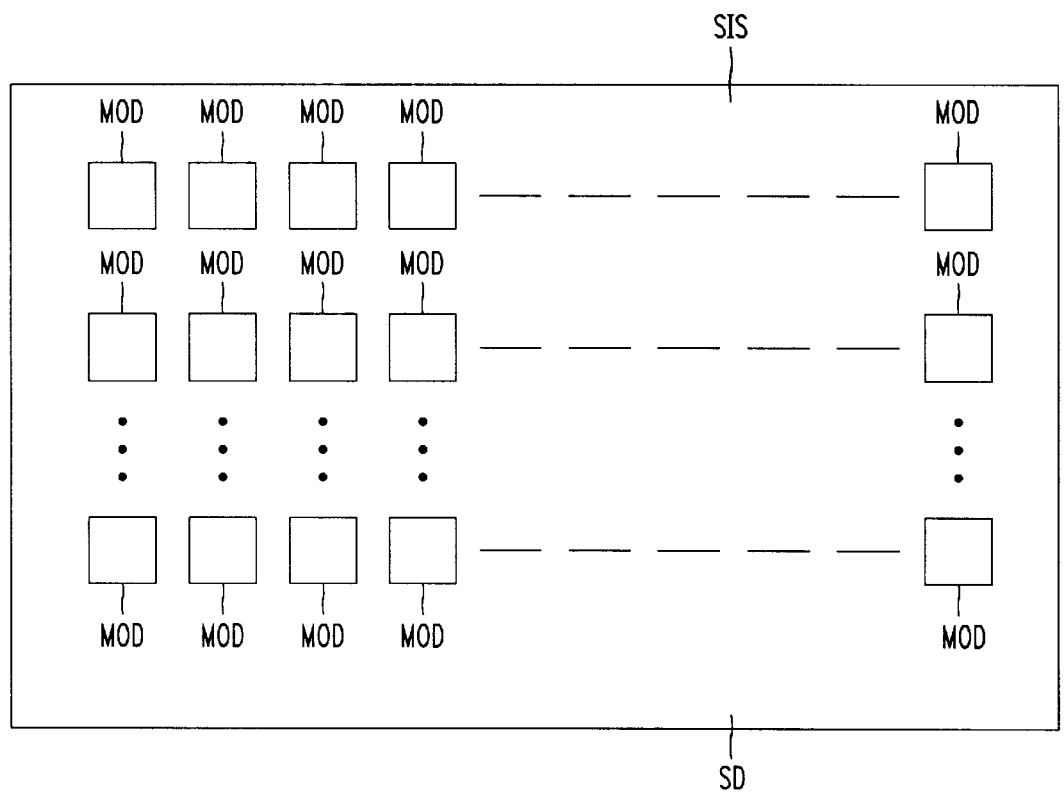
FIG. 6 is a plan view illustrating a device integrating an array of photonic elements on an IC according to an embodiment of the invention.

FIG. 5 shows a single line of modulators MOD. The invention contemplates two dimensional arrays of such modulator MOD as shown in FIG. 6. Because optical input/outputs (I/O's), such as the multiple quantum well modulators MOD, permit transmission and reception normal to the surface of the chip, such two-dimensional arrays offer substantial possibilities for use in hybrid communication and information processing environments.

In operation, the output of an off-chip laser splits into an array of spots and focuses on the multiple quantum well modulators MOD, whose reflectance is modulated by the on-chip electronics. This type of system offers the advantage of having a global clock (for oscillating the laser). In addition, because such modulators are also efficient detectors, one modulator can function as both receiver and transmitter.

Both the layer RL1 and the cement CM1 serve as an etch-resist, and a structural support for the assembled units. The cement used is one having a viscosity low enough to wick between the quantum well modulator, or modulators, MOD and the silicon device SD. For this purpose, the cement CM1 preferably has a viscosity of less than one poise when it is being applied. An example of a cement is an epoxy. In practice, epoxies tend to have lower viscosity at elevated temperatures. Thus the epoxy is applied while maintaining the modulator, or modulators, MOD and the silicon device SD at an elevated temperature, such as 100° C. The latter temperature is lower than the melting point of the solder on the modulator and silicon device. A preferred epoxy is composed of two components, and cures only after a delay following mixing of the components. Such a delay permits application of the epoxy before hardening. Any cement that satisfies the viscosity conditions and is resistant to the substrate-removal etch is suitable. This includes cements that cure on the application of heat without emitting gas or liquid solvents and that set permanently. The term cement is used herein to include epoxies and other cements. A preferred epoxy is available under the trademark Able Bond 931-1 manufactured by Able-Stick Laboratories, a subsidiary of National Starch and Chemical Company, Rancho Dominguez, Calif. 90221. Such an epoxy has low viscosity at room temperature and is stored at −40° C.

Figure 7:
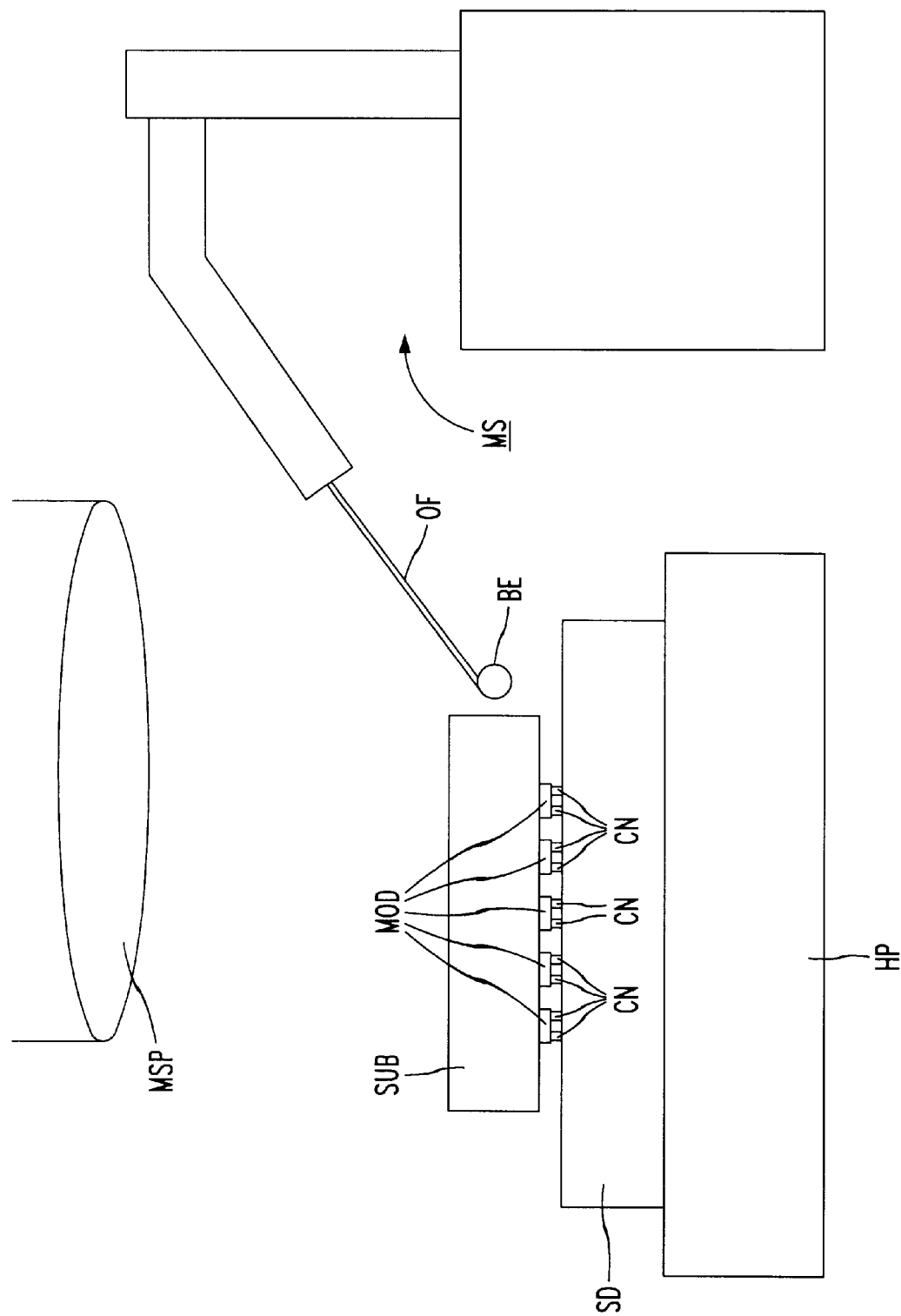
FIG. 7 is a schematic diagram of a system illustrating an arrangement for performing steps in the manufacture of the device according to aspects of the invention.

FIG. 7 illustrates the manner of applying the cement CM1 to a structure such as shown in FIG. 6 and composed of a substrate SUB with a number of modulators MOD connected by contacts CN to the silicon device SD. The layer RL1 covers the substrate SUB and other portions of the modulator MOD. In this example epoxy is used as the cement. However, other suitable cements may be used. This process involves dipping an optical fiber OF into an uncured epoxy, so as to place a bead BE of the epoxy onto the tip of the fiber. A micrometer stage MS holds the fiber OF and allows controlled movement in all directions. While the modulators MOD and the silicon device SD are being viewed through a microscope MSP, the micrometer stage MS places the tip of the fiber OF onto the side of the substrate SUB near the silicon device SD so that the epoxy bead touches the corner or gap formed between the layer RL1 on the substrate and the silicon device. The epoxy then wicks between the layer RL1 on the substrate SUB and the silicon device SD and around the modulators MOD. The modulators MOD and the silicon device SD rest on a heated platform HP to elevate their temperatures to 100° C. during application of the epoxy to reduce the viscosity further. Several epoxy beads may be wicked between the layer RL1 on the substrate SUB and the silicon device SD until the volume between them. The epoxy is then cured by placing the modulators MOD and the silicon device SD with the epoxy into an oven at 100° C. for one hour.

Thereafter the substrate on the modulator MDD is removed. The cement CM1, e.g. the epoxy, is left on the device after the substrate SUB has been removed from the modulators, MOD.

The invention furnishes a technique for solder-bonding one semiconductor device onto another and removing the substrate from one. In particular the invention provides a method of bonding GaAs/AlGaAs 850 nm λ modulators onto silicon. According to an embodiment of the invention this technique forms whole arrays of devices in one step. This technique provides a method for photoelectronic integration of silicon IC's.

The invention enables the substrate of the optical GaAs/AlGaAs modulator to be removed after it is solder-bonded to a silicon chip. Removal of the substrate is necessary since it is opaque to light at the wavelength needed for operation. In addition, substrate removal alleviates mechanical constraints on the bond. An embodiment of the invention includes placing an etch-resist, for example an organic material such as polyimide or benzocyclobutenes or photoresist, or an inorganic material such as silicon nitride or silicon-oxy-nitride or silicon dioxide on the exposed surface of the substrate to be removed, and flowing cement CM1, such as an epoxy, between the chips to allow etching of the substrate. The flow may be enhanced by capillary action. The photoresist or epoxy protects the front sides of the chips during etching and augments mechanical support. The technique can support fabrication of large arrays. Although simple, the invention permits the joining of complex electronic circuits with optical inputs and outputs in large numbers.

An embodiment of the invention involves GaAs/AlGaAs p-i-n multiple quantum well modulators solder-bonded to a silicon substrate. The GaAS substrate is chemically removed to allow operation at an optical wavelength of 850 nm.

The invention promotes the use of photonics in an information processing environment where it is integrated with electronics. The invention takes advantage of the greater capacity of electronics for complexity, functionality, and memory, and the greater capacity of photonics for communications. The photonic devices, such as the multiple quantum well modulators, function as optical interconnects between electronic integrated circuit chips (IC's). The invention involves the integration of photonic elements (both receiver and transmitter) on the IC chip. It takes advantage of the attractive feature of optical input/output (I/O) that it can occur normal to the surface of the chip, and allow two-dimensional arrays of interconnects to be formed, for surface-normal photonic operation.

The invention takes advantage of silicon electronics's effective technology where complex systems such as microprocessors or memory are concerned. It offers the benefit of increased communication capacity to the IC chip when the chip contains a great number of computing elements.

One of the advantages of GaAs/AlGaAs multiple quantum well modulators is their typical operation at 850 nm. This short wavelength allows the formation of small optical spots whose potential spot sizes vary with the wavelength.

The structure and process described in connection with FIGS. 1 to 4 represent a single example of a integrated semiconductor device. Other embodiments of the invention use other dimensions, particularly area dimensions, and different materials. For example any suitable etch-resist, that is any polymer that resists the enchant and that dries into a mechanically sound solid material may be used for the layer RL1 The term etch-resist as used herein can refer to any polymer that dries to protect an underlying solid from the enchant and includes a photoresist and non-polymer layers such as silicon nitride or silicon oxides. A suitable etch-resist for use herein is one that becomes sufficiently solid furnish mechanical support.

According to an embodiment of the invention, not only epoxy, but any insulating cement may be used where the epoxy is used as long as the cement's viscosity permits wicking between the substrates and, upon solidifying, furnishes mechanical strength to the device and provides etch-resistance. The term cement is used herein generically to include air drying thermoplastics, and thermosetting materials such as epoxies, acrylics, and urethanes. The term cured is used herein to mean solidified, and the term uncured refers to the cement in its liquid state.

The term "insulating cement" refers to the cement in its solidified, i.e. cured, form. Preferably it is insulating in its liquid form also but may have non-insulating properties in liquid form.

Moreover the contacts on each semiconductor device need not be coplanar, as long as they complement the heights of the Si-mounted contacts to which they are to be bonded. Also, as an example, the bonding material need not be indium (In). According to other embodiments of the invention, the contacts are gold, or various mixtures of In, Au, Sn, and/or Pb.

Furthermore, the Si device SD need not be a Si IC chip. The Si device SD may be any fully-fabricated semiconductor device such as one made of GaAs. The invention prevents the damage to the semiconductor device which would be caused by growing of one device on the other fully-fabricated device. Moreover, the modulators MOD may have any structure from which a substrate must be removed.

According to an embodiment, the deposition of the layer RL1 is in the form of chemical vapor deposition when inorganic material such as silicon nitride or silicon-oxynitride or silicon oxide is used. In another embodiment inorganic materials are deposited by coating in liquid form and cured.

While embodiments of the invention have been described in detail, it will be evident to those skilled in the art that the invention may be embodied otherwise without departing from its spirit and scope.

What is claimed is:

1. A method of forming an integrated semiconductor device, comprising the steps of:

placing an etch-resist upon a substrate and about conductors of first semiconductor device having a first substrate and conductors.

bonding the conductors of the first semiconductor device to conductors on a second semiconductor device having a second substrate;

flowing cement to fill a space between the etch-resist on the first semiconductor device and the second semiconductor device;

allowing the cement to cure; and removing the substrate from the first semiconductor device.

2. A method as in claim 1 wherein the cement is an epoxy.

3. A method as in claim 1, wherein the step of flowing includes flowing the uncured cement between and around said conductors around said conductors on said second semiconductor device.

4. A method as in claim 1, wherein the step of bonding includes forming surfaces of any one of a group consisting of In, Au, and mixtures of In, Au, Sn, and Pb on the conductors of one of said first semiconductor device and said second semiconductor device.

5. A method as in claim 3, wherein the cement is an epoxy and the step of flowing includes wicking the uncured cement between the etch resist on the first substrate and the second substrate while the conductors of said first semiconductor device and said second semiconductor device are at temperatures above room temperature.

6. A method as in claim 1, wherein the step of flowing includes flowing sufficient cement so that said cement and said etch-resist, when dried, form a structural support from one of the semiconductor devices to the other.

7. A method as in claim 1, wherein the second semiconductor device is a photonic device and the first semiconductor device is a Si device.

8. A method as in claim 1, wherein the first semiconductor device includes a modulator having a GaAs/AlGaAs multiple quantum well modulator unit and said second semiconductor device includes a Si integrated circuit chip.

9. A method as in claim 1, wherein said first semiconductor device includes a plurality of GaAs structures on said substrate of said first semiconductor device, said conductors on said first device including a plurality of terminals on each of said GaAs structures, said second semiconductor device includes a plurality of GaAs structures on said substrate of said second semiconductor device, said conductors on said second device including a plurality of terminals on each of said GaAs structures;

said step of placing an etch-resist includes placing an etch-resist on the substrate of said first structures and about the terminals of each of said structures on said first semiconductor device;

said step of bonding the conductors includes bonding said terminals of said first structures to said terminals of said second structures.

10. A method as in claim 3, wherein the cement is an epoxy and the step of flowing includes wicking the uncured cement between the first and second substrates at room temperature.

* * * * *